United States Patent
Kim et al.

(10) Patent No.: US 9,131,297 B2
(45) Date of Patent: Sep. 8, 2015

(54) METHOD AND APPARATUS FOR PROCESSING AUDIO SIGNAL

(75) Inventors: Han-ki Kim, Suwon-si (KR); Hae-kwang Park, Suwon-si (KR); Dong-hyun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 290 days.

(21) Appl. No.: 13/605,422

(22) Filed: Sep. 6, 2012

(65) Prior Publication Data

US 2013/0058494 A1 Mar. 7, 2013

Related U.S. Application Data

(60) Provisional application No. 61/531,152, filed on Sep. 6, 2011.

(30) Foreign Application Priority Data

Dec. 8, 2011 (KR) .......................... 10-2011-0131116
Jun. 15, 2012 (KR) .......................... 10-2012-0064599

(51) Int. Cl.
H04R 1/10 (2006.01)
H04R 25/00 (2006.01)
H04R 3/00 (2006.01)
H03G 3/30 (2006.01)

(52) U.S. Cl.
CPC ............... *H04R 3/007* (2013.01); *H03G 3/301* (2013.01); *H04R 1/1041* (2013.01)

(58) Field of Classification Search
None
See application file for complete search history.

(56) References Cited

U.S. PATENT DOCUMENTS

| | | | |
|---|---|---|---|
| 5,068,903 A * | 11/1991 | Walker | ............................. 381/96 |
| 8,237,623 B2 * | 8/2012 | Hung | ............................. 343/906 |
| 2005/0090141 A1 | 4/2005 | Peng et al. | |
| 2006/0013079 A1 | 1/2006 | Rekimoto | |
| 2007/0098190 A1 | 5/2007 | Song et al. | |
| 2011/0002471 A1 | 1/2011 | Wihardja et al. | |
| 2011/0099298 A1 | 4/2011 | Chadbourne et al. | |
| 2011/0135109 A1 | 6/2011 | Park et al. | |

FOREIGN PATENT DOCUMENTS

| | | |
|---|---|---|
| EP | 2166737 A1 | 3/2010 |
| JP | 200624241 A | 1/2006 |
| KR | 20020065404 A | 8/2002 |

(Continued)

OTHER PUBLICATIONS

International Search Report for PCT/KR2012/007156, dated Feb. 27, 2013 [PCT/ISA/210].
Written Opinion for PCT/KR2012/007156, dated Feb. 27, 2013 [PCT/ISA/237].
Notification of Transmittal of ISR and Written Opinion for PCT/KR2012/007156, dated Feb. 27, 2013 [PCT/ISA/220].

(Continued)

*Primary Examiner* — Regina N Holder
(74) *Attorney, Agent, or Firm* — Sughrue Mion, PLLC

(57) ABSTRACT

Provided are an audio signal processing apparatus and method. The audio signal processing apparatus includes: a sensing unit for sensing an impedance value of a headphone and adjusting a gain to be applied to an audio signal based on the sensed impedance value; and an amplifier for generating an output audio signal by receiving at least one bias voltage corresponding to the adjusted gain and amplifying the input audio signal according to the adjusted gain. The audio signal processing apparatus is capable of appropriately adjusting the magnitude of an acoustic signal output from a headphone, according to the product specifications of the headphone.

26 Claims, 9 Drawing Sheets

(56) References Cited

FOREIGN PATENT DOCUMENTS

| | | | |
|---|---|---|---|
| KR | 10-2004-0066367 A | 7/2004 | |
| KR | 1020060019683 A | 3/2006 | |
| KR | 100809770 A | 3/2008 | |
| KR | 10-2008-0048632 A | 6/2008 | |
| WO | 2004001552 A2 | 12/2003 | |

OTHER PUBLICATIONS

Communication dated Jul. 24, 2013 issued by the Korean Intellectual Property Office in counterpart Korean Patent Application No. 10-2012-0064599.

Communication dated Feb. 16, 2015, issued by the European Patent Office in counterpart European Application No. 12829659.7.

* cited by examiner

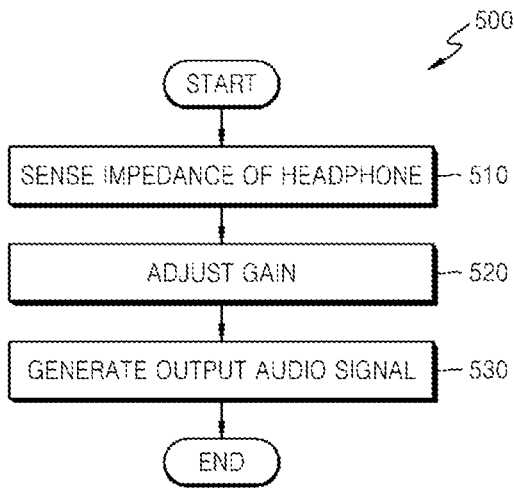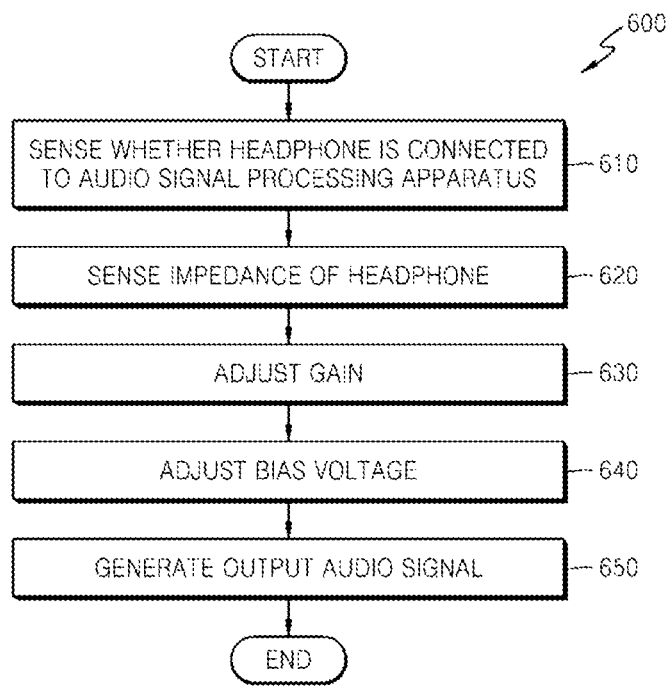

METHOD AND APPARATUS FOR PROCESSING AUDIO SIGNAL

CROSS-REFERENCE TO RELATED PATENT APPLICATIONS

This application claims the benefit of U.S. Provisional Application No. 61/531,152, filed on Sep. 6, 2011 in the United States Patent and Trademark Office, and claims priority from Korean Patent Application No. 10-2011-0131116, filed on Dec. 8, 2011 in the Korean Intellectual Property Office, and Korean Patent Application No. 10-2012-0064599, filed on Jun. 15, 2012 in the Korean Intellectual Property Office, the disclosures of which are incorporated herein in their entireties by reference.

BACKGROUND

1. Field

Apparatuses and methods consistent with exemplary embodiments relate to processing an audio signal, and more particularly, to an audio signal processing apparatus that may be connectable to a headphone and output an audio signal via the headphone, and an audio signal processing method of outputting an audio signal via a headphone.

2. Description of the Related Art

An audio apparatus receives an audio signal, generates an acoustic signal that is audible to a user from the audio signal, and then outputs the acoustic signal.

An audio apparatus may be connected to a headphone so as to output an acoustic signal via the headphone. The headphone may also be referred to as an earphone.

In general, an audio apparatus supplies an audio signal having a fixed maximum voltage to a headphone, and the headphone generates and outputs an acoustic signal from the audio signal.

When a headphone that receives such an audio signal having a fixed maximum voltage is used, the magnitude of sound output from the headphone may vary according to, for example, the manufacturer, model, and product specifications of the headphone. When the magnitude of an acoustic signal output from the headphone is unexpectedly too high, the ears of a user who hears the acoustic signal may be damaged. When the magnitude of the acoustic signal output from the headphone is unexpectedly too low, a user may not exactly sense the acoustic signal and, thus, may have difficulties using an audio apparatus.

Thus, there is a need to develop an audio signal processing method and apparatus for appropriately adjusting the magnitude of an acoustic signal output from a headphone according to, for example, the manufacturer, model, and product specifications of the headphone.

SUMMARY

One or more exemplary embodiments provide an audio signal processing method and apparatus capable of appropriately adjusting the magnitude of an acoustic signal output from a headphone, according to the product specifications of the headphone.

In particular, one or more exemplary embodiments provide an audio signal processing method and apparatus capable of appropriately adjusting the magnitude of an acoustic signal output from a headphone according to an impedance value of the headphone while minimizing power consumption.

One or more exemplary embodiments also provide an audio signal processing method and apparatus capable of easily sensing whether a headphone connected to the audio signal processing apparatus includes a three-pole plug or a four-pole plug.

According to an aspect of an exemplary embodiment, there is provided an audio signal processing apparatus including: a sensor for sensing an impedance value of a headphone, and adjusting a gain to be applied to an input audio signal based on the sensed impedance value; and an amplifier for generating an output audio signal by receiving at least one bias voltage corresponding to the gain adjusted by the sensor and amplifying the input audio signal according to the gain.

The audio signal processing apparatus may further include a power supplier for adjusting the at least one bias voltage according to the gain and applying the adjusted at least one bias voltage to the amplifier.

The power supplier may adjust the at least one bias voltage so as to prevent clipping of the output audio signal.

The power supplier adjusts the at least one bias voltage to be equal to or greater than a maximum voltage of the output audio signal.

The power supplier adjusts the at least one bias voltage to be proportional to the gain.

The sensor may sense the impedance value in units of frequency bands.

The sensor may obtain an impedance value characteristic curve that varies according to a frequency.

The sensor may detect a converging frequency band that is a frequency band in which the impedance value converges to a predetermined value, and obtain an impedance value corresponding to the converging frequency band, as the impedance value of the headphone.

The sensor may obtain an average of impedance values corresponding to the converging frequency band, as the impedance value of the headphone.

The sensor may detect an impedance value corresponding to a frequency band corresponding to a direct-current (DC) voltage component, as the impedance value of the headphone.

The sensor may adjust the gain to maintain power of the output audio signal at a constant level.

The audio signal processing apparatus may further include a headphone connector to be connected to a plug of the headphone, and wherein the sensor may sense whether the headphone is connected to the headphone connector, and sense the impedance value of the headphone when it is determined that the headphone is connected to the headphone connector.

According to an aspect of another exemplary embodiment, there is provided a method of processing an input audio signal, performed by an audio signal processing apparatus that is connectable to a headphone, the method including: sensing an impedance value of a headphone; adjusting a gain to be applied to the input audio signal based on the sensed impedance value; and generating an output audio signal by receiving at least one bias voltage corresponding to the gain adjusted by the sensing unit and amplifying the input audio signal according to the gain.

The method may further include adjusting the at least one bias voltage to be applied to the amplifier, according to the gain.

According to an aspect of another exemplary embodiment, there is provided a computer readable recording medium having recorded thereon a program executable by a computer for performing a method of processing an audio signal, performed by an audio signal processing apparatus that is connectable to a headphone, the method including: controlling to determine an impedance value of the headphone; controlling to adjust a gain to be applied to the audio signal based on the determined impedance value; and controlling to generate an output audio signal by receiving at least one bias voltage corresponding to the gain adjusted by the determining and amplifying the audio signal according to the adjusted gain.

According to an aspect of another exemplary embodiment, there is provided an audio signal processing method including: determining a difference between voltages of a third pole connecting terminal and a fourth pole connecting terminal of an audio signal processing apparatus; and determining whether a plug of a headphone that is inserted into the audio signal processing apparatus is a three-pole plug or a four-pole plug, based on the determined difference between the voltages of the third pole connecting terminal and the fourth pole connecting terminal, wherein the third pole connecting terminal is connectable to a third pole terminal of the headphone, and the fourth pole connecting terminal is connectable to a fourth pole terminal of the headphone.

BRIEF DESCRIPTION OF THE DRAWINGS

The above and other features and advantages will become more apparent by describing in detail exemplary embodiments with reference to the attached drawings in which:

FIG. 5 is a flowchart illustrating an audio signal processing method according to an exemplary embodiment;

FIG. 6 is a flowchart illustrating an audio signal processing method according to another exemplary embodiment;

DETAILED DESCRIPTION OF EXEMPLARY EMBODIMENTS

As used herein, the term "and/or" includes any and all combinations of one or more of the associated listed items. Expressions such as "at least one of," when preceding a list of elements, modify the entire list of elements and do not modify the individual elements of the list.

An impedance value of a headphone may vary according to, for example, the model, manufacturer, and product specifications of the headphone. For example, a headphone may have an impedance value of 16, 32, or 300 ohms. Also, audio apparatuses that output an audio signal have been designed to apply a voltage to headphones based on an assumption that headphones have a predetermined impedance value, e.g., 16 or 32 ohms. Hereinafter, a voltage that is to be applied to a headphone will be referred to as a 'headphone supply voltage'.

For example, if in an audio apparatus, a headphone supply voltage is determined to be 2 V and a gain is determined based on an assumption that a headphone has an impedance value of 32 ohms, then the magnitude of sound output when a headphone having an impedance value of 300 ohms is connected to the audio apparatus is about ten times less than when a headphone having an impedance value of 32 ohms is connected to the audio apparatus.

In this case, due to decreased volume according to the decreased magnitude of sound output, a user who does not know the impedance value of a headphone may have difficulties hearing an audio signal via the headphone.

Figure 1:
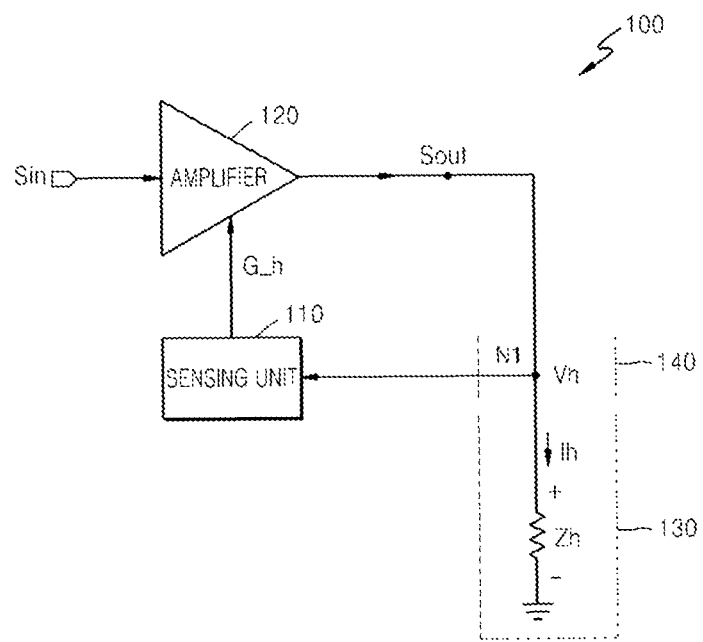
FIG. 1 is a schematic block diagram of an audio signal processing apparatus according to an exemplary embodiment.

Audio signal processing apparatuses and methods capable of maintaining the magnitude of sound of an audio signal at a constant level even if an impedance value of a headphone varies, according to various exemplary embodiments, will now be described FIG. 1 is a schematic block diagram of an audio signal processing apparatus 100 according to an exemplary embodiment. Referring to FIG. 1, the audio signal processing apparatus 100 includes a sensing unit 110 (e.g., sensor) and an amplifier 120. The audio signal processing apparatus 100 may be any of various electronic apparatuses capable of receiving, processing, or outputting an audio signal, e.g., a mobile terminal, an MP3 player, audio equipment, video equipment, a television (TV), a notebook computer, a personal computer (PC), a camera, a phone, etc.

The sensing unit 110 senses an impedance value Zh of a headphone 130, and adjusts a gain G_h to be applied to a received audio signal based on the impedance value Zh. FIG. 1 illustrates that the headphone 130 has a load terminal Zh and is driven by a supply voltage Vh and a current Ih corresponding to an output audio signal Sout of the amplifier 120. Hereinafter, the supply voltage Vh applied to the headphone 130 will be referred to as a 'supply voltage Vh', and the impedance value of the headphone 130 is indicated with 'Zh'.

When a resistor or a load is not present between an output terminal of the amplifier 120 and the headphone 130, i.e., when the output terminal of the amplifier 120 is directly connected to the headphone 130, the supply voltage Vh may be equal to a voltage of the output audio signal Sout.

The amplifier 120 receives an input audio signal Sin. The amplifier 120 is applied with at least one bias voltage Vb (not shown in FIG. 1) corresponding to the gain G_h output from the sensing unit 110, and generates the output audio signal Sout by amplifying the input signal Sin according to the gain G_h. Also, the amplifier 120 supplies the output audio signal Sout to the headphone 130.

For example, the bias voltage Vb applied to the amplifier 120 may have at least one value from among a high power supply voltage, e.g., +Vdd, and a low power supply voltage, e.g., −Vdd, and may be applied from the outside. The amplifier 120 generates the output audio signal Sout, the voltage of which is less than or equal to the bias voltage Vb. In other words, the amplifier 120 is biased to the bias voltage Vb. The bias voltage Vb will be described in detail with reference to FIGS. 3A and 3B below.

The audio signal processing apparatus 100 may further include a headphone connection unit 140. The headphone connection unit 140 is connected to a plug (not shown) of the headphone 130. FIG. 1 illustrates a case where the headphone 130 and the audio signal processing apparatus 100 are connected to each other.

The plug of the headphone 130 may be a three-pole plug or a four-pole plug. The three-pole plug may include a left (L) terminal, a right (R) terminal, and a ground (GND) terminal. The four-pole plug may include a left (L) terminal, a right (R) terminal, a ground (GND) terminal, and a microphone (MIC) terminal. The headphone connection unit 140 may include a connection port (not shown) to be connected to the three-pole plug and/or the four-pole plug.

The sensing unit 110 may sense whether the headphone 130 is connected to the audio signal processing apparatus 100, via the headphone connection unit 140 (e.g., headphone connector). The headphone connection unit 140 may include, for example, a terminal, a plug, a socket, etc. When it is determined that the headphone 130 is connected to the audio signal processing apparatus 100, the impedance value of the headphone 130 may be sensed by the sensing unit 110. The impedance value of the headphone 130 may be automatically sensed by the sensing unit 110 when the headphone connection unit 140 is connected to the plug of the headphone 130.

Figure 2:
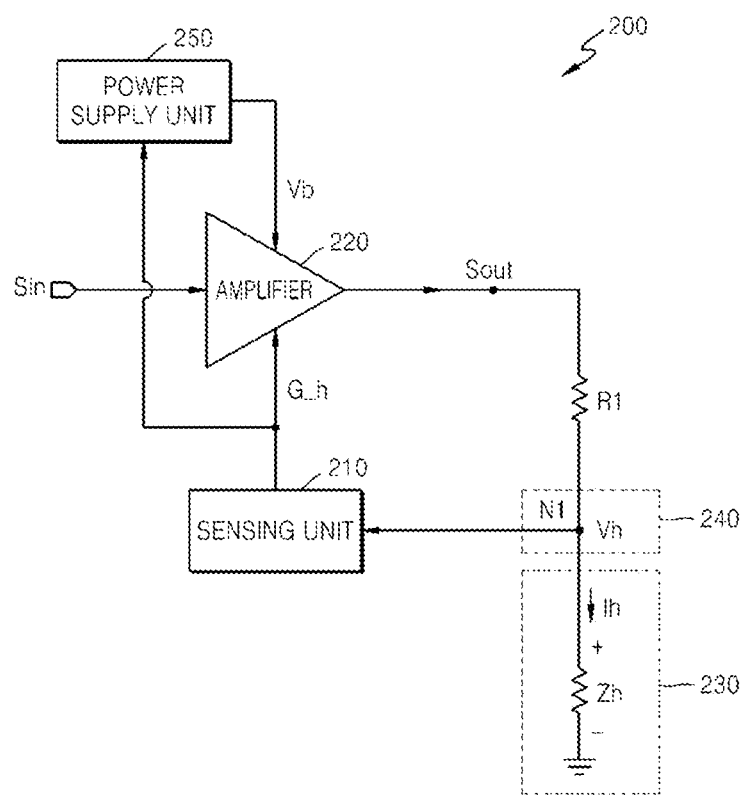
FIG. 2 is a schematic block diagram of an audio signal processing apparatus according to another exemplary embodiment.

FIG. 2 is a schematic block diagram of an audio signal processing apparatus 200 according to another exemplary embodiment. Referring to FIG. 2, the audio signal processing apparatus 200 may include a sensing unit 210, an amplifier 220, and a power supply unit 250 (e.g., power supplier). The audio signal processing apparatus 200 may further include a headphone connection unit 240.

The sensing unit 210, the amplifier 220, and the headphone connection unit 240 of FIG. 2 correspond to the sensing unit 110, the amplifier 120, and the headphone connection unit 140 of FIG. 1, respectively, and thus will not be described again here. The audio signal processing apparatus 200 may further include the power supply unit 250, unlike the audio signal processing apparatus 100 of FIG. 1.

The power supply unit 250 adjusts at least one bias voltage Vb according to a gain G_g output from the sensing unit 210, and applies the adjusted at least one bias voltage Vb to the amplifier 220.

The audio signal processing apparatus 200 may further include a resistor R1 to sense an impedance value of a headphone 230. For example, a voltage corresponding to an output audio signal Sout of the amplifier 220 is divided according to a ratio between a resistance value of the resistor R1 and an impedance value Zh. If a supply voltage Vh is sensed, the sensing unit 210 may calculate the impedance value Zh by using a voltage divider rule based on the ratio between the resistance value of the resistor R1 and the impedance value Zh.

Figures 3A, 3B:
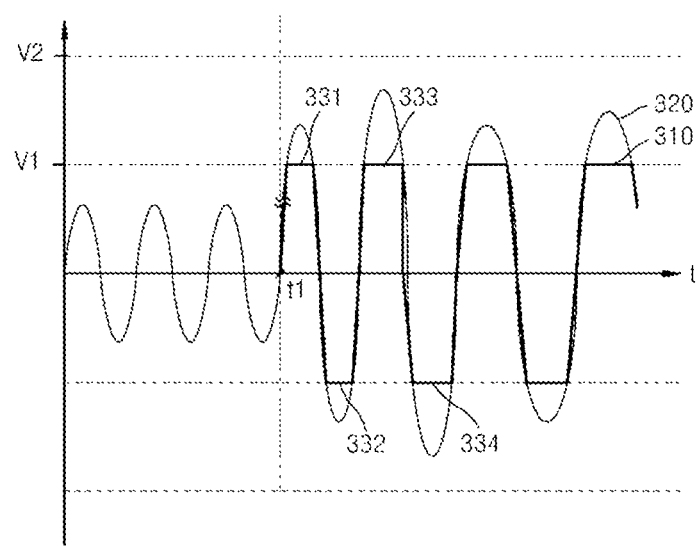
FIGS. 3A and 3B are diagrams illustrating an operation of an audio signal processing apparatus according to an exemplary embodiment.

FIGS. 3A and 3B are diagrams illustrating an operation of an audio signal processing apparatus according to an exemplary embodiment. FIG. 3A illustrates gain adjustment of the sensing unit 210 of FIG. 2 according to an exemplary embodiment. FIG. 3B illustrates a bias voltage Vb applied from the power supply unit 250 of FIG. 2 and an output signal Sout of the amplifier 220 of FIG. 2, according to an exemplary embodiment.

Referring to FIGS. 2 and 3A, an output power P of the headphone 230 is proportional to a square of a voltage V and is inversely proportional to an impedance value Z of the headphone 230.

For example, if the impedance value Z of the headphone 230 is 32 ohms and a supply voltage Vh applied to the headphone 230 is 2 V, then output power P of the headphone 230 is about 61 mW. In this case, a gain G_h that the sensing unit 210 outputs to the amplifier 220 is '1'. The actual output power P and an output power P calculated by an equation illustrated in FIG. 3A may be different from each other due to ambient conditions or parasitic resistance components.

The sensing unit 210 may store the impedance value of the headphone 230 and a gain corresponding to the impedance value. Also, the sensing unit 210 may store an equation of calculating the gain G_h, and calculate a gain by using the stored equation. The gain corresponding to the impedance value of the headphone 230 or the equation may vary according to the model or product specifications of the headphone 230 or the model or product specifications of the audio signal processing apparatus 200.

A case where the impedance value Z is changed to be 300 ohms due to a headphone having a different model or product specifications being connected to the audio signal processing apparatus 200 will now be described.

Referring to FIG. 3A, if the impedance value Z is changed to be 300 ohms, the sensing unit 210 may adjust the gain G_h to '3.06' according to the changed impedance value Z. In this case, the amplifier 220 amplifies an input audio signal Sin by the gain G_h and outputs the input audio signal having a voltage of 6.12 V.

If the impedance value of headphone 230 is 300 ohms and the supply voltage Vh is 6.12 V, then the output power P is maintained at about 61 mW. That is, the sensing unit 210 may adjust the gain G_h so that an output power of the output audio signal Sout may be maintained constant. Here, the output power of the output audio signal Sout is equal to the output power P of the headphone 230. Also, the output power P of the headphone 230 is proportional to the magnitude of sound of an audio signal output from the headphone 230.

As described above, in the audio signal processing apparatus 200 according to an exemplary embodiment, the sensing unit 210 may adjust the gain G_h to be applied to the amplifier 220 according to the impedance value Z of the headphone 230, thereby maintaining the magnitude of sound of an audio signal output from the headphone 230 at a constant level regardless of the impedance value Z of the headphone 230.

Referring to FIG. 3B, the X-axis denotes time and the Y-axis denotes a voltage. A graph 310 denotes an output audio signal Sout when a bias voltage Vb has a value of 'V1', and a graph 320 denotes an output audio signal Sout when the bias voltage Vb has a value of 'V2'.

The graph of FIG. 3B shows a variation in the supply voltage Vh when an impedance value of the headphone 230 connected to the audio signal processing apparatus 200 is 32 ohms, i.e., before a point of time t1, and when the impedance value of the headphone 230 connected to the audio signal processing apparatus 200 is changed to be 300 ohms, i.e., after the point of time t1.

Referring to FIGS. 3A and 3B, before the point of time t1, the impedance value of the headphone 230 is 32 ohms and the supply voltage Vh is 2 V. In this case, the power supply unit 250 applies the bias voltage Vb having the value of V1 according to the gain V_h set by the sensing unit 210.

The power supply unit 250 adjusts the bias voltage Vb according to the gain G_h. In detail, the power supply unit 250 may adjust the bias voltage Vb to be proportional to the gain G_h. The bias voltage Vb may be set to be equal to or greater than a maximum voltage of the output audio signal 320.

In detail, the bias voltage Vb may be set to be greater by a predetermined margin than the maximum voltage of the output audio signal 320 when the gain G_h is applied. The predetermined margin may vary according to the maximum voltage of the output audio signal 320, the product specifications of the audio signal processing apparatus 200, or the like.

Referring to FIGS. 3A and 3B, after the point of time t1, the impedance value of the headphone 230 is 300 ohms and the supply voltage Vh is 6.12 V according to the adjusted gain G_h. If an increase in the gain G_h results in an increase in the supply voltage Vh, the output audio signal 320 is clipped based on the bias voltage Vb being equal to V1 and is then output as in the graph 310 so as to maintain the bias voltage Vb to be V1 as before the point of time t1. In other words, the output audio signal 320 is clipped in time periods 331, 332, 333, and 334 in which the bias voltage Vb is less than or greater than 'V1'. In the time periods 331, 332, 333, and 334, the output audio signal 320 is distorted, thus degrading sound quality.

The power supply unit 250 adjusts the bias voltage Vb to 'V2' and outputs the adjusted bias voltage Vb, after the point of time t1 when the impedance value of the headphone 230 changes.

In other words, the audio signal processing apparatus 200 may adjust the bias voltage Vb according to the gain G_h so that the output audio signal 320 may be output while not being clipped.

The sensing unit 210 may store the bias voltage Vb corresponding to the gain G_h, and provide information about the corresponding bias voltage Vb to the power supply unit 250. Thus, the power supply unit 250 may adjust and output the bias voltage Vb, based on the information about the corresponding bias voltage Vb received from the sensing unit 210. Thus, the power supply unit 250 may generate the bias voltage Vb in such a manner that the output audio signal Sout may not be clipped, thereby reducing power consumption more than compared to when the bias voltage Vb is unconditionally generated to be high.

As described above, in the audio signal processing apparatuses 100 and 200 according to exemplary embodiments, a gain G_h and a bias voltage Vb are adjusted according to an impedance value Zh of a headphone 130 and 230, thereby maintaining the magnitude of sound of an audio signal output from the headphone 130 and 230 at a constant level and preventing an output audio signal from being clipped. Thus, the audio signal processing apparatuses 100 and 200 are capable of preventing an audio signal from being distorted and maintaining the magnitude of sound of an audio signal output from the headphone 130 and 230 at a constant level according to an impedance value of the headphone 130 and 230.

Also, the sensing unit 210 may sense the impedance value of the headphone 230 in units of frequency bands. In detail, the impedance value of the headphone 230 may be sensed in units of frequency bands so as to obtain an impedance value characteristic curve according to a variation in a frequency. The impedance value characteristic curve will be described with reference to FIG. 4 below.

Figure 4:
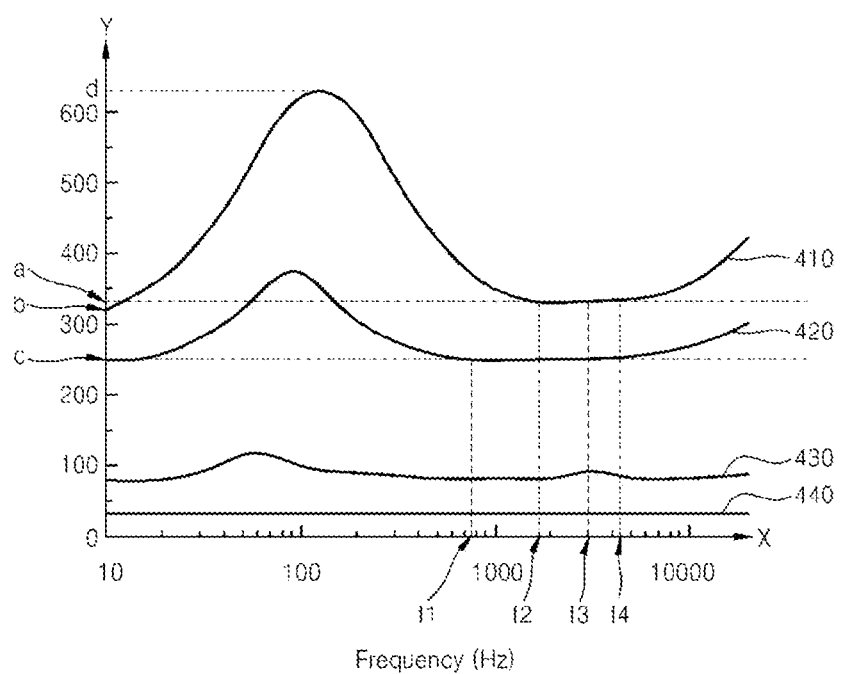
FIG. 4 is a graph showing a variation in an impedance value of a headphone.

FIG. 4 is a graph showing a variation in an impedance value of a headphone according to an exemplary embodiment. In FIG. 4, the X-axis denotes frequency expressed in units of hertz (Hz), and the Y-axis denotes an impedance value of the headphone, expressed in units of ohms.

In FIG. 4, graphs 410, 420, 430, and 440 denote impedance value characteristic curves corresponding to different headphone models. For example, a headphone manufactured by a manufacturer A may have impedance value characteristics shown in the graph 410, a headphone manufactured by a manufacturer B may have impedance value characteristics shown in the graph 420, a headphone manufactured by a manufacturer C may have impedance value characteristics shown in the graph 430, and a headphone manufactured by a manufacturer D may have impedance value characteristics shown in the graph 440.

Referring to FIG. 4, the headphones have different impedance value characteristics in units of frequencies, according to the manufacturers, models, or product specifications thereof.

Also, the same headphone may have different impedance values in units of frequency bands. Referring to the graph 440, the headphone of the manufacturer D has the same or similar impedance values in units of frequencies. In contrast, referring to the graph 410, the headphone of the manufacturer A has very different impedance values in units of frequency bands.

Referring to the graph 410, the headphone of the manufacturer A has an impedance value of about 320 ohms at a low frequency of 10 Hz corresponding to a direct-current (DC) voltage component. As the frequency increases, the impedance value of the headphone increases to about 620 ohms. The headphone of the manufacturer A has an impedance value that converges to ohms in a frequency band f2 to f4.

Referring to the graph 420, the headphone of the manufacturer B has an impedance value of about 250 ohms (c ohms) at 10 Hz. As the frequency increases, the impedance value of the headphone increases to about 350 ohms. The headphone of the manufacturer B has an impedance value that converges to c ohms from a frequency band f1 to f3.

Here, a frequency band in which an impedance value of a headphone converges to a predetermined value is referred to as a 'converging frequency band'. The sensing unit 210 may obtain an impedance value within a converging frequency band, as an impedance value of a headphone. In detail, an average of impedance values corresponding to the converging frequency band may be obtained as an impedance value of a headphone. A gain G_h is adjusted according to the obtained impedance value.

For example, b ohms corresponding to the frequency band f2 to f4 which is the converging frequency band is obtained as an impedance of the headphone of the manufacturer A.

Also, the sensing unit 210 may obtain an impedance value corresponding to a frequency band corresponding to a DC voltage component, as an impedance value of a headphone. The DC voltage component is a voltage component in a low-frequency band, and the frequency band corresponding to the DC voltage component is a frequency band having a smallest frequency. For example, in the case of the headphone of the manufacturer B, a frequency band corresponding to a DC voltage component having a value similar to a matching impedance value is a frequency band that is less than or greater than 10 Hz. Thus, c ohms may be sensed as an impedance value of the headphone of the manufacturer B.

FIG. 5 is a flowchart illustrating an audio signal processing method 500 according to an exemplary embodiment. Referring to FIG. 5, the audio signal processing method 500 is a method of processing an input audio signal, performed by an audio signal processing apparatus that is connectable to a headphone. The audio signal processing method 500 may be performed by the audio signal processing apparatus 100 or 200 of FIG. 1 or 2. The audio signal processing method 500 will now be described with reference to FIGS. 2 and 5.

Referring to FIG. 5, in the audio signal processing method 500, in operation 510, an impedance value of a headphone 230 connected to the audio signal processing apparatus 200 is sensed. Operation 510 may be performed by the sensing unit 210.

Then, in operation 520, a gain G_h that is to be applied to an input audio signal Sin is adjusted based on the impedance value sensed in operation 510. Operation 520 may be performed by the sensing unit 210.

Then, in operation 530, an output audio signal Sout is generated by receiving at least one bias voltage Vb corresponding to the gain G_h adjusted in operation 520, and amplifying the input audio signal Sin according to the gain G_h. Operation 530 may be performed by the amplifier 220.

The technical idea of the audio signal processing method 500 of FIG. 5 is the same as or similar to the operations of the audio signal processing apparatus 100 of FIG. 1. Thus, descriptions of the audio signal processing method 500 that are the same as or similar to the operations of the audio signal processing apparatus 100 will not be repeated here.

FIG. 6 is a flowchart illustrating an audio signal processing method 600 according to another exemplary embodiment. The audio signal processing method 600 may further include at least one from among operations 610 and 640, unlike the audio signal processing method 500 of FIG. 5. Operations 620, 630, and 650 of the audio signal processing method 600 correspond to operations 510, 520, and 530 of the audio signal processing method 500, respectively, and thus will not be described again here.

Referring to FIGS. 2 and 6, in the audio signal processing method 600, in operation 640, it is sensed whether the headphone 230 is connected the audio signal processing apparatus 200. Operation 610 may be performed by determining whether a plug (not shown) of the headphone 230 is connected to the headphone connection unit 240, by using the sensing unit 210. In operation 630, if it is determined in operation 610 that the headphone 230 is connected to the audio signal processing apparatus 200, then an impedance value of the headphone 230 may be sensed.

Although not shown, operation 620 may include sensing the impedance value of the headphone 230 in units of frequency bands.

In operation 630, a gain G_h that is to be applied to an input audio signal Sin is adjusted based on the impedance value sensed in operation 620.

Then, in operation 640, at least one bias voltage Vb that is to be applied to the amplifier 220 may be adjusted according to the gain G_h adjusted in operation 630. Operation 650 may be performed by the power supply unit 250.

Although not shown, operation 640 may include adjusting the at least one bias voltage Vb so that an output audio signal Sout may not be clipped.

Then, in operation 650, the output audio signal Sout may be generated from the at least one bias voltage Vb adjusted in operation 640.

The technical idea of the audio signal processing method 600 of FIG. 6 is the same as or similar to the operations of the audio signal processing apparatus 100 of FIG. 1. Thus, descriptions of the audio signal processing method 600 that are the same as or similar to the operations of the audio signal processing apparatus 100 will not be repeated again here.

Figure 7:
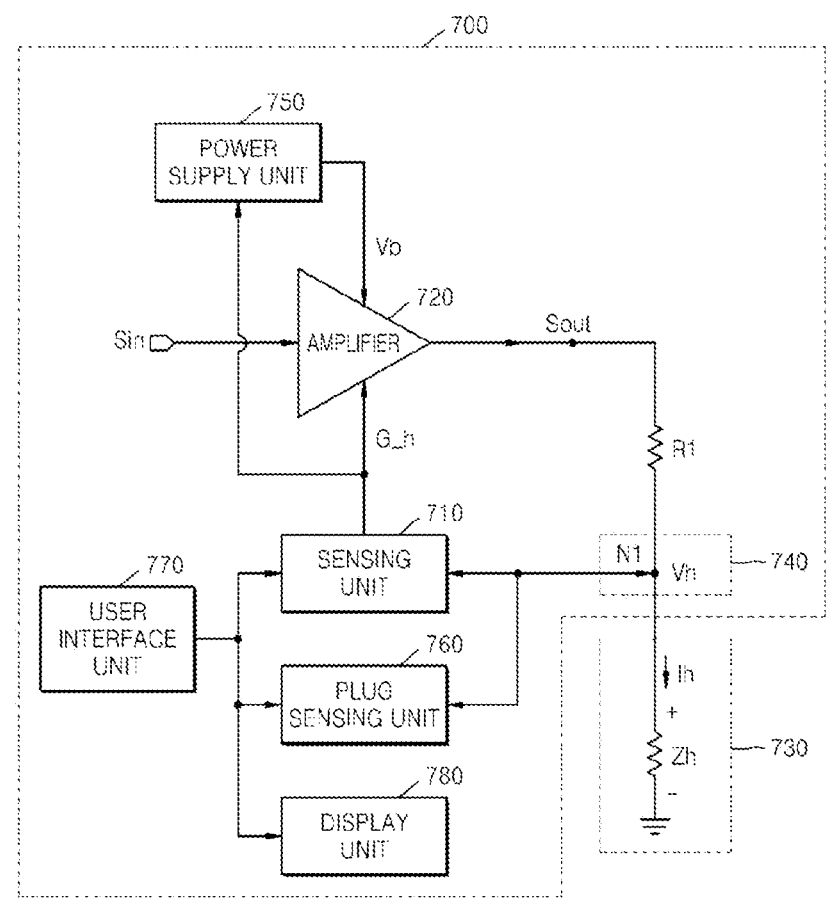
FIG. 7 is a schematic block diagram of an audio signal processing apparatus according to another exemplary embodiment.

FIG. 7 is a schematic block diagram of an audio signal processing apparatus 700 according to another exemplary embodiment. Referring to FIG. 7, the audio signal processing apparatus 700 includes a headphone connection unit 740 and a plug sensing unit 760 (e.g., plug sensor). The audio signal processing apparatus 700 further includes a sensing unit 710, an amplifier 720, and a power supply unit 750. The sensing unit 710, the amplifier 720, a headphone 730, the headphone connection unit 740, and the power supply unit 750 of FIG. 7 correspond to the sensing unit 210, the amplifier 220, the headphone 230, the headphone connection unit 240, and the power supply unit 250 of FIG. 2, respectively, and thus will not be described again here.

The headphone connection unit 740 will now be described in detail with reference to FIG. 8.

Figure 8:
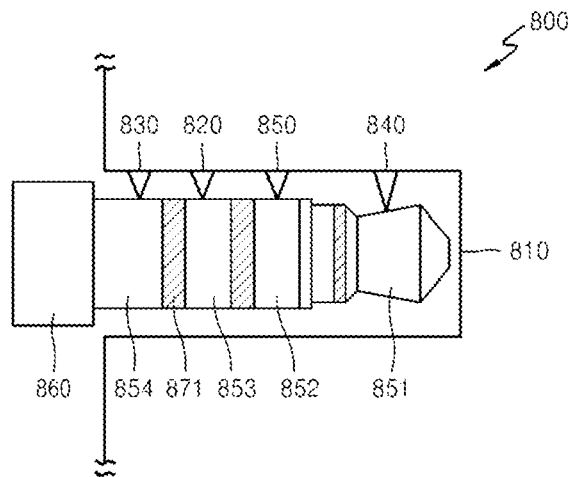
FIG. 8 illustrates a headphone connection unit such as shown in FIG. 7, according to an exemplary embodiment.

FIG. 8 illustrates a headphone connection unit 800 such as shown in FIG. 7, according to an exemplary embodiment. The headphone connection unit 800 corresponds to the headphone connection unit 740 of FIG. 7.

The headphone connection unit 800 includes a plug inserting unit 810 (e.g., plug inserer), a third pole connecting terminal 820, and a fourth pole connecting terminal 830. The headphone connection unit 800 connects the headphone 730 of FIG. 7 to the audio signal processing apparatus 700 of FIG. 7.

A plug 860 of the headphone 730 is inserted into the plug inserting unit 810.

The third pole connecting terminal 820 is connected to a third pole terminal 853 of the headphone 730.

The fourth pole connecting terminal 830 is connected to a fourth pole terminal 854 of the headphone 730.

The plug 860 of the headphone 730 may include three or four terminals. The plug 860 may be referred to as a three-pole plug when the plug 860 includes three terminals, and may be referred to as a four-pole plug when the plug 860 includes four terminals. FIG. 8 illustrates a case where the plug 860 is a four-pole plug.

When the plug 860 is a four-pole plug, the plug 860 includes four terminals, i.e., a first pole terminal 851, a second pole terminal 852, the third pole terminal 853, and the fourth pole terminal 854. The first to fourth pole terminals 851 to 854 may be a left (L) terminal, a right (R) terminal, a ground (GND) terminal, and a microphone (MIC) terminal, respectively. Otherwise, when the plug 860 is a four-pole plug, the first to fourth pole terminals 851 to 854 may be a left (L) terminal, a right (R) terminal, a microphone (MIC) terminal, and a ground (GND) terminal, respectively. Also, an insulating ring 871 may be between two adjacent terminals, e.g., the third pole terminal 853 and the fourth pole terminal 854, so as to electrically disconnect the adjacent two terminals from each other.

If the plug 860 is a three-pole plug, the plug 860 includes only a left (L) terminal, a right (R) terminal, and a ground (GND) terminal. That is, the third pole terminal 853 and the fourth pole terminal 854 are not separated from each other and are provided together as one ground (GND) terminal. In this case, the insulating ring 871 is not needed to electrically disconnect the third and fourth terminals 853 and 854 from each other.

The headphone connection unit 800 further includes a first pole connecting terminal 840 and a second pole connecting terminal 850. The first pole connecting terminal 840 and the second pole connecting terminal 850 are connected to the first pole terminal 851 and the second pole terminal 852, respectively.

The plug sensing unit 760 determines whether the plug 860 is a three-pole plug or a four-pole plug, based on the difference between voltages of the third pole connecting terminal 853 and the fourth pole connecting terminal 854. The plug sensing unit 760 will now be described in detail with reference to FIG. 9.

Figure 9:
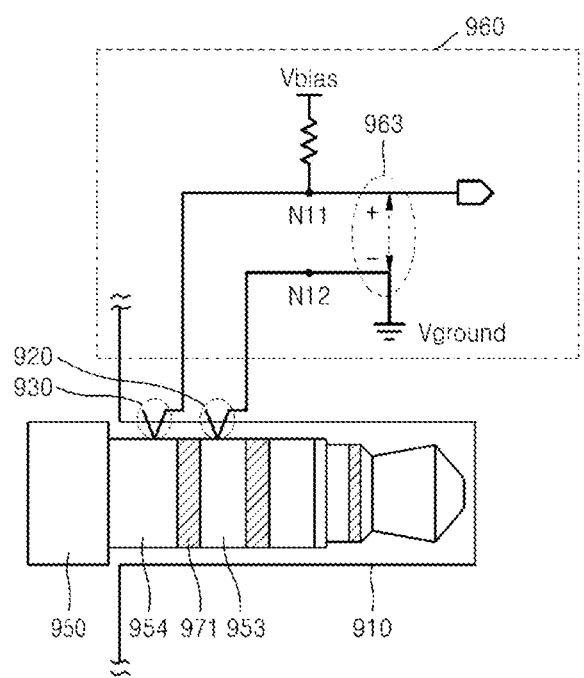
FIG. 9 illustrates a plug sensing unit such as shown in FIG. 8, according to an exemplary embodiment.

FIG. 9 illustrates a plug sensing unit 960 such as shown in FIG. 8, according to an exemplary embodiment. In FIG. 9, a plug inserting unit 910, a third pole connecting terminal 920, a fourth pole connecting terminal 930, a plug 950, and a plug sensing unit 960 correspond to the plug inserting unit 810, the third pole connecting terminal 820, the fourth pole connecting terminal 830, the plug 860, and the plug sensing unit 860 of FIG. 8, respectively, and thus, will not be described again here.

The plug sensing unit 960 senses the difference between a voltage applied to the third pole connecting terminal 920 and a voltage applied to the fourth pole connecting terminal 930. To this end, the third pole connecting terminal 920 may be connected to a low power supply voltage source and the fourth pole connecting terminal 930 may be connected to a high power supply voltage source. The high power supply voltage source may be a bias voltage Vbias source, and the low power supply voltage source may be a ground voltage Vground source. The third pole connecting terminal 920 may be connected to the high power supply voltage source, and the fourth pole connecting terminal 930 may be connected to the low power supply voltage source.

In detail, the plug sensing unit 960 senses a voltage 963 that is the difference between a voltage of a node N12 sensed by the third pole connecting terminal 920 and a voltage of a node N11 sensed by the fourth pole connecting terminal 930. If the difference between voltages of the third pole connecting terminal 920 and the fourth pole connecting terminal 930 is zero, the plug 950 may be determined to be a three-pole plug.

When the plug 950 is a three-pole plug, the third pole connecting terminal 920 and the fourth pole connecting terminal 930 are provided together as one ground (GND) terminal, and are short circuited from each other. Thus, the difference between voltages of the third pole connecting terminal 920 and the fourth pole connecting terminal 930 is or approximates zero. In this case, the plug sensing unit 960 may determine that the plug 950 is a three-pole plug.

When the plug 950 is a four-pole plug, the third pole connecting terminal 920 and the fourth pole connecting terminal 930 are separated via an insulating ring 971 and are thus insulated from each other. Thus, the ground voltage Vground is applied to the third pole connecting terminal 920 and the bias voltage Vbs is applied to the fourth pole connecting terminal 930. Thus, the difference between voltages of the third pole connecting terminal 920 and the fourth pole connecting terminal 930 is (bias voltage Vbias–the ground voltage Vground). Accordingly, the plug sensing unit 960 may determine that the plug 950 is a four-pole plug when the difference between voltages of the third pole connecting terminal 920 and the fourth pole connecting terminal 930 is similar or equal to the difference between the high and low power supply voltages, i.e., (bias voltage Vbias–the ground voltage Vground).

As described above, when the plug 950 is a four-pole plug, the third pole connecting terminal 920 and the fourth pole connecting terminal 930 are separated via the insulating ring 971 and are, thus, insulated from each other. Thus, impedance between the third pole connecting terminal 920 and the fourth pole connecting terminal 930 is high impedance. In other words, a connection between the third pole connecting terminal 920 and the fourth pole connecting terminal 930 is open.

The plug sensing unit 960 may determine that the plug 950 is a four-pole plug when the impedance value between the third pole connecting terminal 920 and the fourth pole connecting terminal 930 is high.

Referring back to FIG. 7, the audio signal processing apparatus 700 includes the sensing unit 710, the amplifier 720, and the power supply unit 750 as described above, and may further include at least one from among a user interface unit 770 and a display unit 780 (e.g., displayer).

The sensing unit 710 senses an impedance value of the headphone 730. Compared to the sensing unit 110 or 210 of FIG. 1 or 2, the sensing unit 710 may sense the impedance value of the headphone 730 and may not adjust a gain G_h to be applied to an input audio signal.

The user interface unit 770 (e.g., user interface generator) generates a user interface (UI) screen for selecting whether the gain G_h is to be applied to an input audio signal according to the sensed impedance value. The UI screen will now be described in detail with reference to FIGS. 10 and 11.

The display unit 780 displays the UI screen. Examples of the display unit 780 include a liquid crystal display (LCD) panel, an organic light emitting diode (OLED) display, a cathode ray tube (CRT) display, a plasma display, a light emitting diode display, etc.

Figure 10:
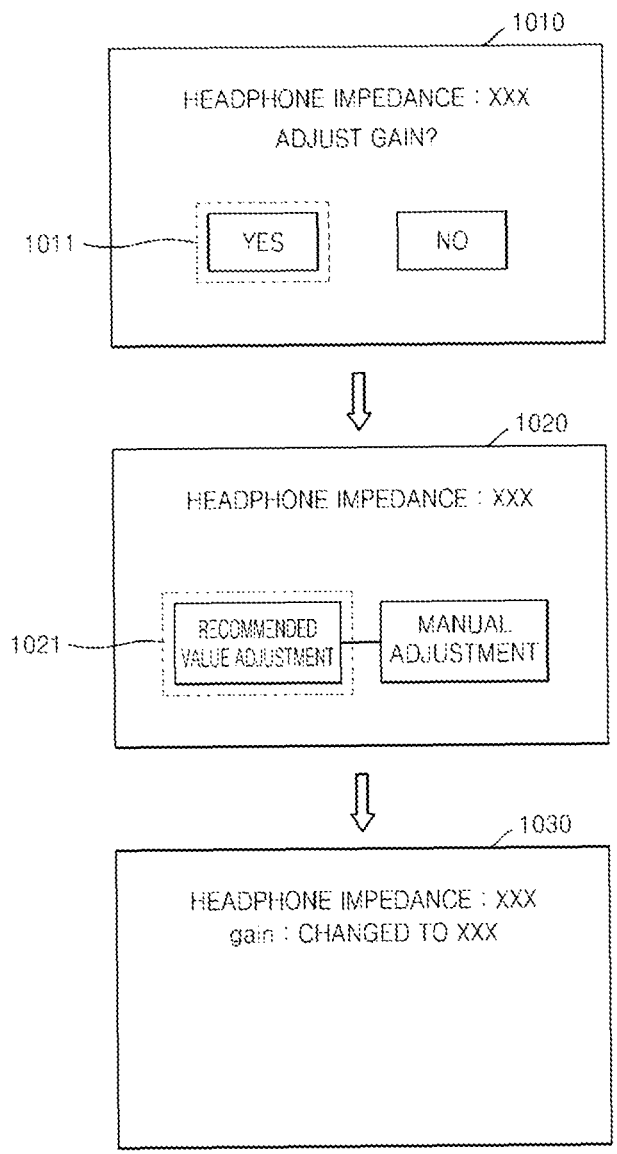
FIG. 10 illustrates a user interface (UI) screen generated by a user interface unit of FIG. 7, according to an exemplary embodiment.

FIG. 10 illustrates a UI screen generated by the user interface unit 770 of FIG. 7, according to an exemplary embodiment.

As described above with reference to FIG. 7, the sensing unit 710 may sense an impedance value of the headphone 730, and adjust a gain G_h to be applied to an input audio signal, according to the sensed impedance value.

Referring to FIG. 10, the user interface unit 770 may generate a UI screen 1010 for selecting whether the gain G_h is to be applied to an input audio signal according to the sensed impedance value.

When a user clicks a 'yes' key 1011 on the UI screen 1010 displayed on the display unit 780 of FIG. 7 so as to adjust the gain G_h, the user interface unit 770 may output a UI screen 1020 for selecting whether the gain G_h is to be adjusted to either a recommended gain corresponding to the impedance value of the headphone 730 or a desired value that the user wants. If the user selects a 'recommended gain' key 1021, the gain G_h is adjusted to the recommended gain that is an optimum gain corresponding to the sensed impedance value.

When the gain G_h is changed, the user interface unit 770 may generate a UI screen 1030 for allowing the user to recognize the changed gain G_h.

Figure 11:
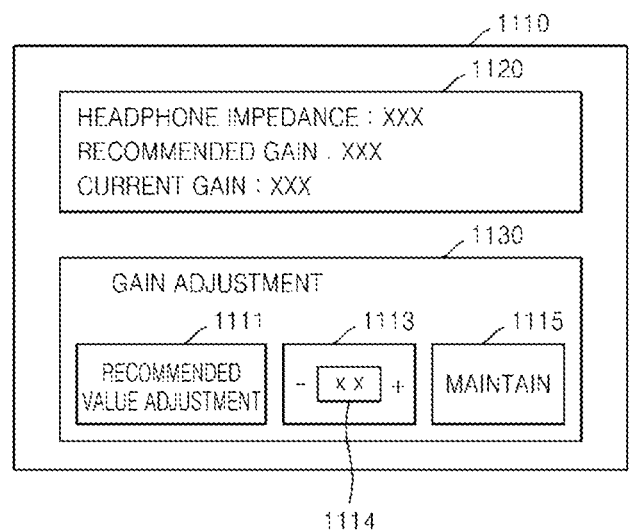
FIG. 11 illustrates a UI screen generated by the user interface unit of FIG. 7, according to another exemplary embodiment.

FIG. 11 illustrates a UI screen generated by the user interface unit 770 of FIG. 7, according to an exemplary embodiment. Referring to FIG. 11, the user interface unit 770 may generate a UI screen 1110 for adjusting a gain to be applied to an input audio signal according to a sensed impedance value of a headphone.

The UI screen 1110 may include a menu 1120 for displaying the sensed impedance value, a current gain applied to the audio signal processing apparatus 700 of FIG. 7, and a recommended gain which is optimized according to the sensed impedance value.

The UI screen 1110 may further include a 'gain adjustment' menu 1130 for adjusting a gain.

The gain adjustment menu 1130 may include a 'recommended value' key 1111 for setting the gain to be applied to the input audio signal as the recommended gain, a gain increase/decrease key 1113 for adjusting a gain, and a 'maintain' key 1115 for maintaining the existing gain. The gain increase/decrease key 1113 may include a window 1114 for displaying an adjusted gain.

When a gain is adjusted, the user interface unit 770 may further generate a UI screen (not shown) for adjusting the bias voltage Vb described above with reference to FIG. 2 or 3 according to the adjusted gain. The UI screen for adjusting the bias voltage Vb is displayed on the display unit 780, and a user may adjust or maintain the bias voltage Vb by using the displayed UI screen.

Furthermore, the sensing unit 700 may control the user interface unit 770 to not generate the UI screen for adjusting the bias voltage Vb, and allow the bias voltage Vb to be automatically controlled according to the adjusted gain.

As described above with reference to FIGS. 10 and 11, it is possible to allow a user to control a gain according to a sensed impedance value of a headphone by using the user interface unit 770, thereby setting a desired gain according to user request.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more units of the above-described apparatuses can include circuitry, a processor, a microprocessor, etc., and may execute a computer program stored in a computer-readable medium.

While exemplary embodiments have been particularly shown and described above, it will be understood by those of ordinary skill in the art that various changes in form and details may be made therein without departing from the spirit and scope of the present inventive concept as defined by the following claims.

What is claimed is:

1. An audio signal processing apparatus comprising:
    a sensor which determines an impedance value of a headphone, and adjusts a gain to be applied to an audio signal based on the determined impedance value;
    a power supplier which adjust at least one bias voltage based on the determined impedance value received from the sensor; and
    an amplifier which generates an output audio signal using the adjusted at least one bias voltage from the power supplier and the adjusted gain from the sensor and which amplifies the audio signal generated from the received adjusted at least one bias voltage based on the adjusted gain,
    wherein the power supplier adjusts the at least one bias voltage to be proportional to the adjusted gain and adjusts the at least one bias voltage to be equal to or greater than a maximum voltage of the output audio signal, and
    wherein the amplifier generates the output audio signal, which is an unclipped output audio signal obtained using the adjusted at least one bias voltage and the proportional adjusted gain.

2. The audio signal processing apparatus of claim 1, wherein the sensor senses the impedance value in units of frequency bands.

3. The audio signal processing apparatus of claim 2, wherein the sensor obtains an impedance value characteristic curve of the headphone that varies according to a frequency.

4. The audio signal processing apparatus of claim 2, wherein the sensor detects an impedance value corresponding to a frequency band corresponding to a direct-current (DC) voltage component, as the impedance value of the headphone.

5. The audio signal processing apparatus of claim 1, wherein the sensor adjusts the gain to maintain power of the output audio signal at a constant level.

6. The audio signal processing apparatus of claim 1, further comprising a headphone connector connectable to a plug of the headphone, and
    wherein the sensor senses whether the headphone is connected to the headphone connector, and senses the impedance value of the headphone in response to sensing that the headphone is connected to the headphone connector.

7. The audio signal processing apparatus of claim 6, wherein the headphone connector comprises:
    a plug inserter into which the plug of the headphone is insertable;
    a third pole connecting terminal connectable to a third pole terminal of the headphone; and
    a fourth pole connecting terminal connectable to a fourth pole terminal of the headphone, and
    the audio signal processing apparatus further comprises a plug sensor which determines whether the plug is a three-pole plug or a four-pole plug, based on a difference between voltages of the third pole connecting terminal and the fourth pole connecting terminal.

8. The audio signal processing apparatus of claim 1, further comprising:
    a user interface generator which generates a user interface screen for selecting whether the gain applied to the output audio signal is to be adjusted based on the sensed impedance value; and
    a display which displays the generated user interlace screen,
    wherein the user interface screen comprises:
        an impedance field indicating the sensed impedance value of the headphone;
        a manual adjustment field in which a user manually inputs the gain; and
        a recommended value adjustment field in which a recommended gain is provided which is calculated by the audio signal processing apparatus based on the measured impedance of the headphone.

9. The audio signal processing apparatus of claim 1, further comprising:
    a user interface generator which generates a user interface screen for selecting whether the gain applied to the output audio signal is to be adjusted based on the sensed impedance value; and
    a display which displays the generated user interface screen,
    wherein the user interface screen comprises:
        an impedance field indicating the sensed impedance value of the headphone; and
        a gain adjustment interface comprising a recommended gain value field which indicates a recommended gain which is calculated by the audio signal processing apparatus based on the measured impedance of the headphone and a manual adjustment element which is manipulated by a user to adjust the recommended gain.

10. An audio signal processing apparatus comprising:
    a sensor which determines an impedance value of a headphone, and adjusts a gain to be applied to an audio signal based on the determined impedance value; and
    an amplifier which generates an output audio signal by receiving at least one bias voltage corresponding to the adjusted gain and amplifies the audio signal according to the adjusted gain,
    wherein the sensor senses the impedance value of the headphone in units of frequency bands, and
    wherein the sensor detects a converging frequency band that is a frequency band in which the impedance value converges to a predetermined value, and obtains an impedance value corresponding to the converging frequency band, as the impedance value of the headphone.

11. The audio signal processing apparatus of claim 10, wherein the sensor obtains an average of impedance values corresponding to the converging frequency band, as the impedance value of the headphone.

12. A method of processing an audio signal, performed by an audio signal processing apparatus that is connectable to a headphone, the method comprising:
   determining an impedance value of the headphone;
   adjusting a gain to be applied to the audio signal based on the determined impedance value;
   adjusting at least one bias voltage based on the determined impedance value to be proportional to the adjusted gain and to equal to or be greater than a maximum voltage of the output audio signal;
   applying the adjusted at least one bias voltage to the amplifier; and
   generating the output audio signal by using the adjusted at least one bias voltage and the adjusted gain and amplifying the audio signal generated from the received adjusted at least one bias voltage based on the adjusted gain,
   wherein the generated output audio signal is an unclipped output audio signal obtained using the adjusted at least one bias voltage and the proportional adjusted gain.

13. The method of claim 12, wherein the determining the impedance value of the headphone comprises:
   sensing whether the headphone is connected to a headphone connector of the audio signal processing apparatus; and
   sensing the impedance value of the headphone in response to sensing that the headphone is connected to the headphone connector.

14. The method of claim 12, wherein the determining the impedance value of the headphone comprises sensing the impedance value in units of frequency bands.

15. The method of claim 14, wherein the determining the impedance value of the headphone comprises detecting an impedance value corresponding to a frequency band corresponding to a direct-current (DC) voltage component, as the impedance value of the headphone.

16. The method of claim 12, wherein the adjusting the gain comprises adjusting the gain to maintain power of the output audio signal at a constant level.

17. A method of processing an audio signal, performed by an audio signal processing apparatus that is connectable to a headphone, the method comprising:
   determining an impedance value of the headphone,
   adjusting a gain to be applied to the audio signal based on the determined impedance value; and
   generating an output audio signal by receiving at least one bias voltage corresponding to the gain adjusted by the determining and amplifying the audio signal according to the adjusted gain,
   wherein the determining the impedance value of the headphone comprises sensing the impedance value in units of frequency bands,
   wherein the sensing the impedance value in the units of the frequency bands comprises:
      detecting a converging frequency band that is a frequency band in which the impedance value converges to a predetermined value; and
      obtaining an impedance value corresponding to the converging frequency band, as the impedance value of the headphone.

18. The method of claim 17, wherein the obtaining the impedance value corresponding to the converging frequency band comprises obtaining an average of impedance values corresponding to the converging frequency band, as the impedance value of the headphone.

19. An audio signal processing apparatus comprising:
   a plug inserter into which a plug of a headphone is insertable;
   a third pole connecting terminal connectable to a third pole terminal of the headphone;
   a fourth pole connecting terminal connectable to a fourth pole terminal of the headphone; and
   a plug sensor which determines whether the plug is a three-pole plug or a four-pole plug, based on a difference between voltages of the third pole connecting terminal and the fourth pole connecting terminal.

20. The audio signal processing apparatus of claim 19, wherein:
   the third pole connecting terminal is connected to a low power supply voltage source;
   the fourth pole connecting terminal is connected to a high power supply voltage source; and
   the plug sensor determines that the plug is the three-pole plug in response to the difference between voltages of the third pole connecting terminal and the fourth pole connecting terminal being zero.

21. The audio signal processing apparatus of claim 20, wherein the plug sensor determines that the plug is the four-pole plug in response to the difference between voltages of the third pole connecting terminal and the fourth pole connecting terminal being equal to a difference between a high power supply voltage and a low power supply voltage.

22. The audio signal processing apparatus of claim 20, wherein the plug sensor determines that the plug is the four-pole plug in response to an impedance between the fourth pole connecting terminal and the third pole connecting terminal being a high impedance.

23. The audio signal processing apparatus of claim 19, wherein:
   the third pole connecting terminal is connected to a high power supply voltage source;
   the fourth pole connecting terminal is connected to a low power supply voltage source; and
   the plug sensor determines that the plug is the three-pole plug in response to the difference between voltages of the third pole connecting terminal and the fourth pole connecting terminal being zero.

24. A non-transitory computer readable recording medium having recorded thereon a program executable by a computer for performing a method of processing an audio signal, the method comprising:
   controlling to determine an impedance value of a headphone;
   controlling to adjust a gain to be applied to the audio signal based on the determined impedance value;
   adjusting at least one bias voltage based on the determined impedance value;
   applying the adjusted at least one bias voltage to the amplifier; and
   controlling to generate an output audio signal using the adjusted at least one bias voltage and the adjusted gain and amplifying the generated output audio signal obtained using the adjusted at least one bias voltage and based on the adjusted gain, wherein the at least one bias voltage is adjusted to be proportional to the adjusted gain and to be equal to or greater than a maximum voltage of the generated output audio signal, and wherein the amplifier generates the output audio signal, which is an unclipped output audio signal obtained using the adjusted at least one bias voltage and the proportional adjusted gain.

25. An audio signal processing method comprising:

determining a difference between voltages of a third pole connecting terminal and a fourth pole connecting terminal of an audio signal processing apparatus; and determining whether a plug of a headphone that is inserted into the audio signal processing apparatus is a three-pole plug or a four-pole plug, based on the determined difference between the voltages of the third pole connecting terminal and the fourth pole connecting terminal, wherein the third pole connecting terminal is connectable to a third pole terminal of the headphone, and the fourth pole connecting terminal is connectable to a fourth pole terminal of the headphone.

26. A non-transitory computer readable recording medium having recorded thereon a program executable by a computer for performing the method of claim 25.

\* \* \* \* \*